United States Patent
Arnhold

(10) Patent No.: US 12,075,576 B2
(45) Date of Patent: Aug. 27, 2024

(54) MODULE OF AN EXPLOSION-PROOF HOUSING

(71) Applicant: R. STAHL SCHALTGERÄTE GMBH, Waldenburg (DE)

(72) Inventor: Thorsten Arnhold, Pfedelbach (DE)

(73) Assignee: R. STAHL SCHALTGERATE GMBH, Waldenburg (DE)

( * ) Notice: Subject to any disclaimer, the term of this patent is extended or adjusted under 35 U.S.C. 154(b) by 182 days.

(21) Appl. No.: 17/611,888

(22) PCT Filed: May 11, 2020

(86) PCT No.: PCT/EP2020/063041
§ 371 (c)(1),
(2) Date: Nov. 16, 2021

(87) PCT Pub. No.: WO2020/234023
PCT Pub. Date: Nov. 26, 2020

(65) Prior Publication Data
US 2022/0240397 A1    Jul. 28, 2022

(30) Foreign Application Priority Data
May 17, 2019    (DE) .................. 10 2019 113 194.4

(51) Int. Cl.
*H05K 5/02*    (2006.01)

(52) U.S. Cl.
CPC .................. *H05K 5/0213* (2013.01)

(58) Field of Classification Search
CPC ............. F41H 5/06; F41H 5/24; A62B 99/00
See application file for complete search history.

(56) References Cited

U.S. PATENT DOCUMENTS

| | | |
|---|---|---|
| 5,231,247 A | 7/1993 | Paul et al. |
| 11,015,911 B2 | 5/2021 | Arnhold et al. |
| 2020/0149852 A1 | 5/2020 | Arnhold et al. |
| 2022/0216676 A1* | 7/2022 | Arnhold .................. H02B 1/28 |

FOREIGN PATENT DOCUMENTS

| | | |
|---|---|---|
| DE | 102017112153 A1 | 12/2018 |
| DE | 102017112159 A1 | 12/2018 |
| EP | 1365491 A1 | 11/2003 |
| GB | 2519806 A | 5/2015 |

(Continued)

OTHER PUBLICATIONS

WO 2018/219713 A1 Translation (Year: 2023).*

(Continued)

*Primary Examiner* — Hoa C Nguyen
*Assistant Examiner* — John B Freal
(74) *Attorney, Agent, or Firm* — CANTOR COLBURN LLP

(57) ABSTRACT

A module for producing a housing, in particular a housing of the 'flameproof enclosure' protection type, is provided, wherein the housing surrounds an interior space suitable for accommodating components that can form ignition sources. The module establishes at least one module interior space, which is fluidically connected to the interior space of the housing via a connection opening. The module can be used to produce vented housings having different interior volumes.

17 Claims, 8 Drawing Sheets

(56) References Cited

FOREIGN PATENT DOCUMENTS

WO      2015063268 A1    5/2015
WO      2018219713 A1    12/2018
WO   WO-2018219713 A1 *  12/2018  .............. F42C 19/02

OTHER PUBLICATIONS

German Office Action for Application No. 102019113194.4; Date of Mailing: Jul. 10, 2020; 4 Pages.
German Office Action for Application No. 102019113194.4; Date of Mailing: Mar. 3, 2020; 10 Pages.
International Search Report for International Application No. PCT/EP2020/063041; Date of Completion: Aug. 6, 2020; Date of Mailing: Aug. 14, 2020; 11 Pages.
Translation of International Search Report for International Application No. PCT/EP2020/063041; Date of Completion: Aug. 6, 2020; Date of Mailing: Aug. 14, 2020; 3 Pages.
Written Opinion for International Application No. PCT/EP2020/063041; Date of Mailing: Aug. 14, 2020; 6 Pages.
Chinese Office Action dated Sep. 16, 2023; CN Application No. 202080036851.5; 7 pages (non-English).

* cited by examiner

MODULE OF AN EXPLOSION-PROOF HOUSING

CROSS REFERENCE TO RELATED APPLICATIONS

This application is a National Stage Application of PCT/EP2020/063041, filed on May 11, 2020, which claims the benefit of German Application No. 102019113194.4, filed on May 17, 2019, the contents each of which are incorporated by reference in their entirety herein.

TECHNICAL FIELD

The invention relates to the field of explosion-proof housings, in particular according to the 'flameproof enclosure' protection type (Ex d).

BACKGROUND

Explosion-proof housings are known from the prior art. For example, DE 10 2017 112 159 A1 discloses a housing comprising a housing wall including inner cavities, which contribute, on the one hand, to relieving pressure in the interior space and, on the other hand, to increasing the deformation resistance of the housing wall.

There is a need for an improved concept for producing a housing having a vented interior space.

BRIEF SUMMARY

To solve the problem, a module for producing a housing, the housing surrounding an interior space suitable for accommodating components that can form ignition sources, the module establishing at least one module interior space, which is fluidically connected to the interior space of the housing through a connection opening.

The module according to the invention forms a module type of a modular system according to the invention for producing a housing. The housing can in particular be designed according to the 'flameproof enclosure' protection type. Such housings must withstand an ignition of an explosive gas mixture taking place in the housing's interior space and the subsequent increase in pressure. Moreover, the housings must be designed in such a way that no flames or particle embers acting as ignition sources are able to make their way to the outside. In the event that gaps are present, these must have a minimum length and must not exceed a maximum width. Housing openings can be provided with gas-permeable, but flameproof pressure relief bodies, which are also referred to as flame arresting filters and prevent an explosion ignited in the housing from penetrating to the outside and igniting an explosive mixture present in the environment. The housing surrounds an interior space, which is intended to accommodate components that can form ignition sources.

The module establishes at least one module interior space, which is fluidically connected via a connection opening to the interior space of the housing. The connection opening can be part of the module. As an alternative or in addition, the module interior space can be fluidically connected to the interior space of the housing via a connection opening of a further module.

According to the invention, a method for producing a housing comprising the module and a modular system comprising at least one module are also provided.

Further advantageous features of the module according to the invention, of the housing according to the invention, of the method according to the invention, as well as of the modular system according to the invention can be derived from the following description:

The module interior space can be closed with respect to the surrounding area of the housing. As an alternative, the module interior space, when the housing has been produced, is fluidically connected to the surrounding area of the housing via at least one venting opening of the housing.

The wall surfaces of the module interior space act in a heat-absorbing manner, so that the module interior space helps to reduce pressure peaks, and thus to reduce mechanical stresses of the housing wall. The module interior space can be connected to the interior space via one or more connection openings. The module interior space acts as a cooling and pressure relief volume, whereby the pressure peak during an explosion in the interior space is mitigated. The module interior space preferably has a larger surface-to-volume ratio than the interior space of the housing so that penetrating gases are cooled better than in the interior space.

The module can comprise a base element, which holds at least one wall element delimiting the module interior space. The base element can be L-shaped (angled) or U-shaped, for example. The base element can be frame-shaped. The base element can be a casting. The at least one wall element can be a sheet metal element. The module interior space can be delimited between at least two wall elements, which are arranged on one side of the base element or on opposite sides of the base element (for example an inner side with an outer side).

Preferably, multiple modules of the modular system, for example multiple (at least two) identical modules (multiple specimens of the same type) and/or modules of different types can be arranged in succession, so as to form an assembled channel made of fluidically contiguous module interior spaces. The module interior spaces themselves are preferably channel-shaped, elongated. For example, the modules can be arrangeable in a row to form the channel. In the case of modules that are arranged in succession, as is intended by the modular system, ports of the module interior spaces are preferably aligned with respect to one another. The ports can, in particular, be aligned flush with one another. The ports can abut one another. In this way, it is particularly easy to connect the module interior spaces to form the assembled channel.

The module can comprise a connection opening. The connection opening is preferably closed in sections, or completely, by a gas-permeable pressure relief body. In any case, gas is preferably able to flow through the pressure relief body into the module interior space. The pressure relief body preferably has narrow pores and/or gaps, which prevent flame propagation. This prevents gas already present in the module interior space from igniting, which mitigates the explosion and further reduces the pressure peak. Regardless of whether or not the pressure relief body is flameproof, such a pressure relief body can withdraw heat from gas flowing through, and additionally cool this gas, if necessary, through expansion, for example as a result of the Joule-Thomson effect and/or through adiabatic expansion and/or through the ability thereof to absorb heat. These effects help to reduce the volume, and thus to relieve pressure.

The pressure relief body can, for example, be a wire gauze sintered body, a random fiber body, an otherwise sintered body, metallic or ceramic foam, or the like. The pressure relief body comprises open-pored material, that is, gas is able to pass through the pressure relief body through gaps in the pressure relief body, with heat being given off to the pressure relief body in the process.

In addition, a housing is provided, produced by way of at least one of the modules according to the invention. The housing preferably includes a venting opening, which fluidically connects the module interior space to the surrounding area of the housing. A venting opening is preferably provided on at least one end of the channel that is formed through at least one module interior space or through multiple (at least two) assembled module interior spaces. A port opening of a module interior space is preferably directed at the venting opening of the housing. The port opening of a module interior space can be aligned with the venting opening. The port opening can abut the venting opening. In embodiments, the port opening can form a venting opening of the housing.

It is possible for the connection openings not to be closed in a flameproof manner, so that an explosion in the interior space, in principle, can result in the ignition of gas in the intermediate volume, formed by the one or more, possibly assembled, module interior spaces. Nevertheless, and in particular when the connection openings are closed by gas-permeable pressure relief bodies, the intermediate volume helps to reduce pressure. When the module interior spaces communicate via venting openings, these must be closed in a flameproof manner if the housing is supposed to be flameproof. If, in contrast, the connection openings are flameproof so as to separate the housing interior space from the module interior spaces in a flameproof manner, the venting openings do not necessarily have to be closed in a flameproof manner. However, they can still be closed in a flameproof manner to prevent an explosion of gas in the module interior space from rolling over into the surrounding area.

BRIEF DESCRIPTION OF THE DRAWINGS

Further exemplary features of the invention will be apparent from the dependent claims, the description and the figures. In the drawings:

DETAILED DESCRIPTION

Figure 1:
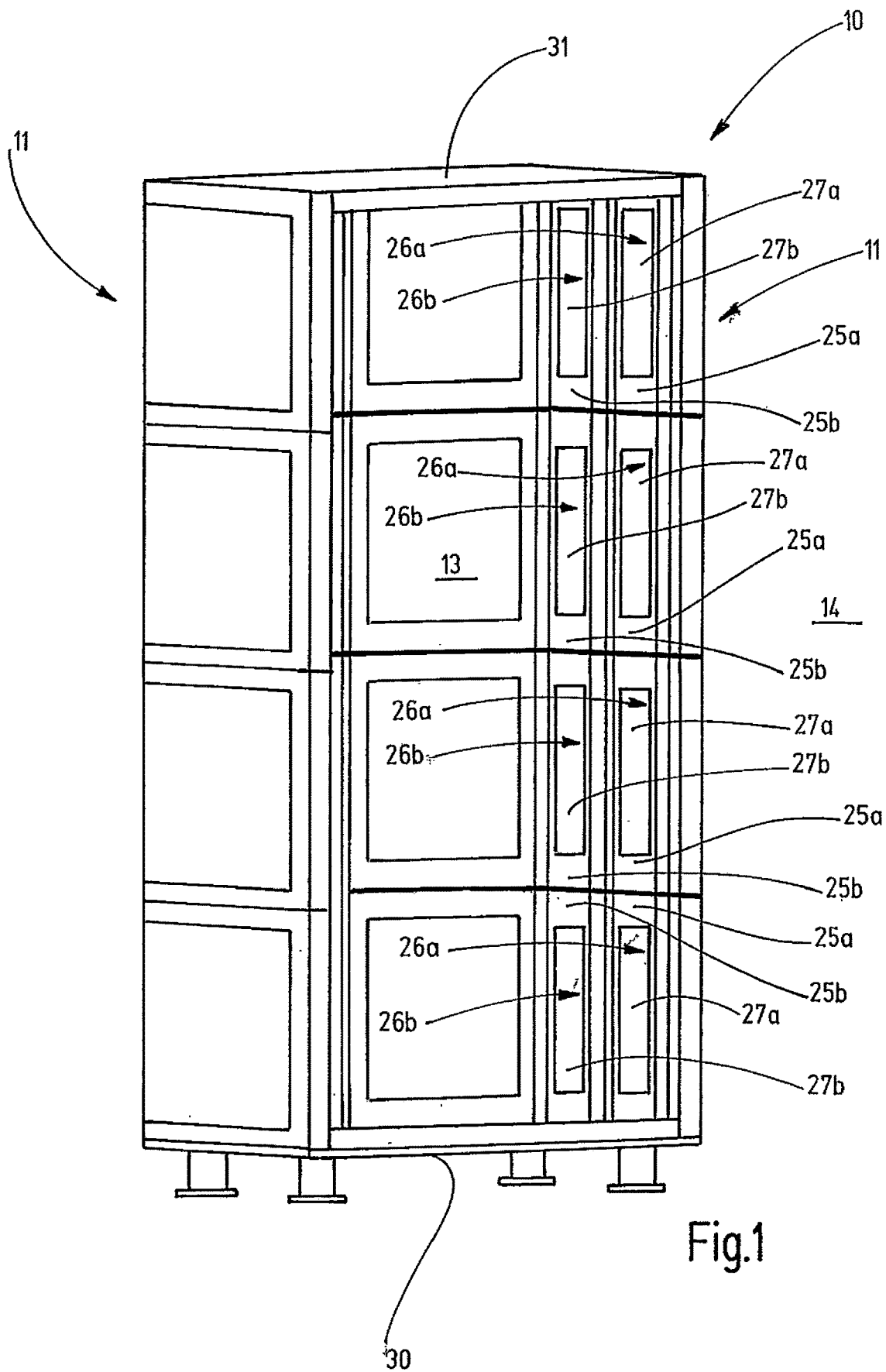
FIG. 1 shows a perspective view of an exemplary embodiment of a housing according to the invention.
Figure 2:
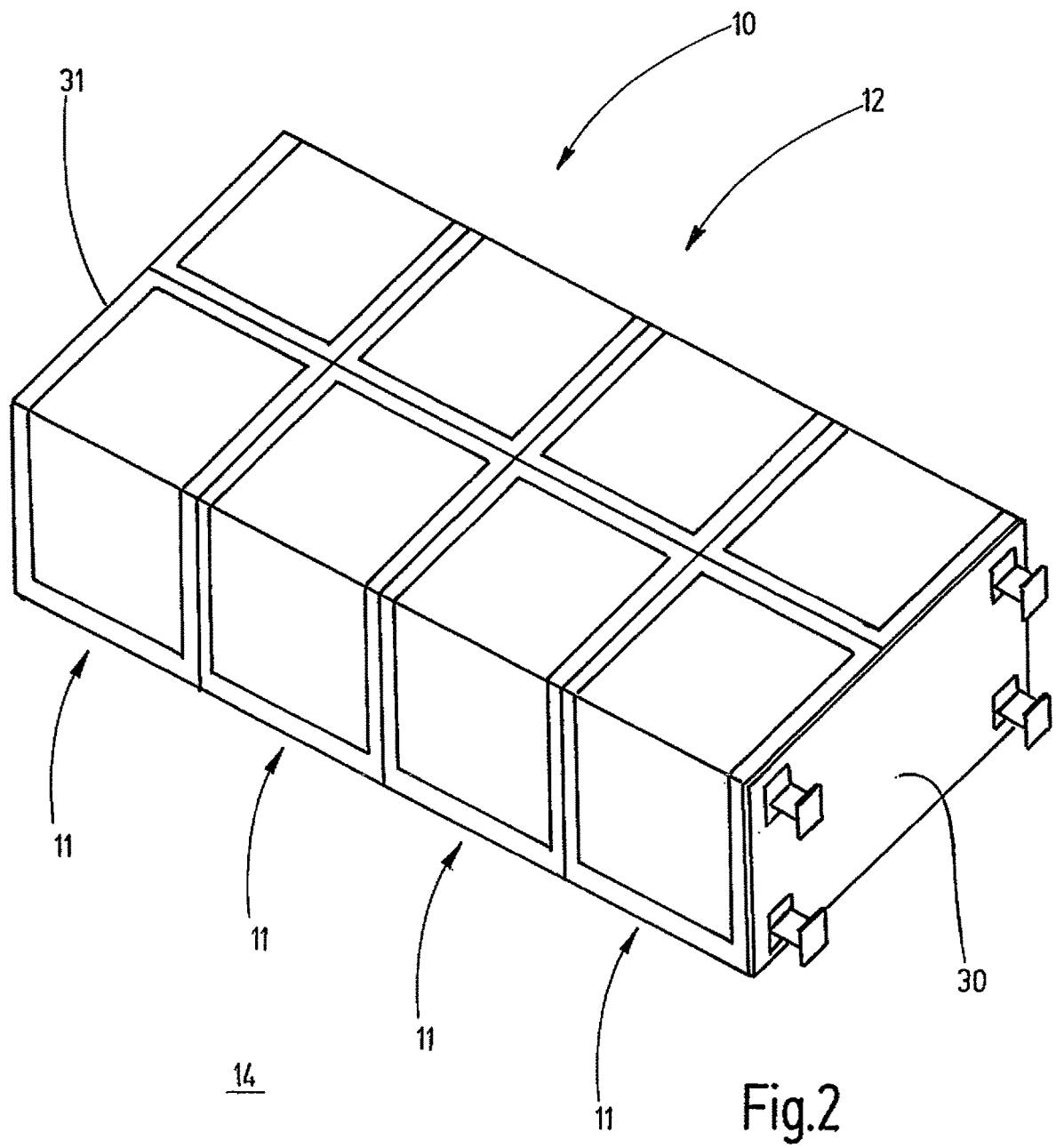
FIG. 2 shows a further perspective view of the housing according to FIG. 1.

FIG. 1 illustrates a housing 10 according to the invention that is designed to be explosion-proof, preferably according to the 'flameproof enclosure' protection type (for example, Ex d according EN 60079-0). The housing 10 is composed of wall modules 11 of a modular system according to the invention for producing the housing 10. FIG. 2 shows a different perspective view of the housing 10, looking at the rear side 12 of the housing 10.

Figure 3A:
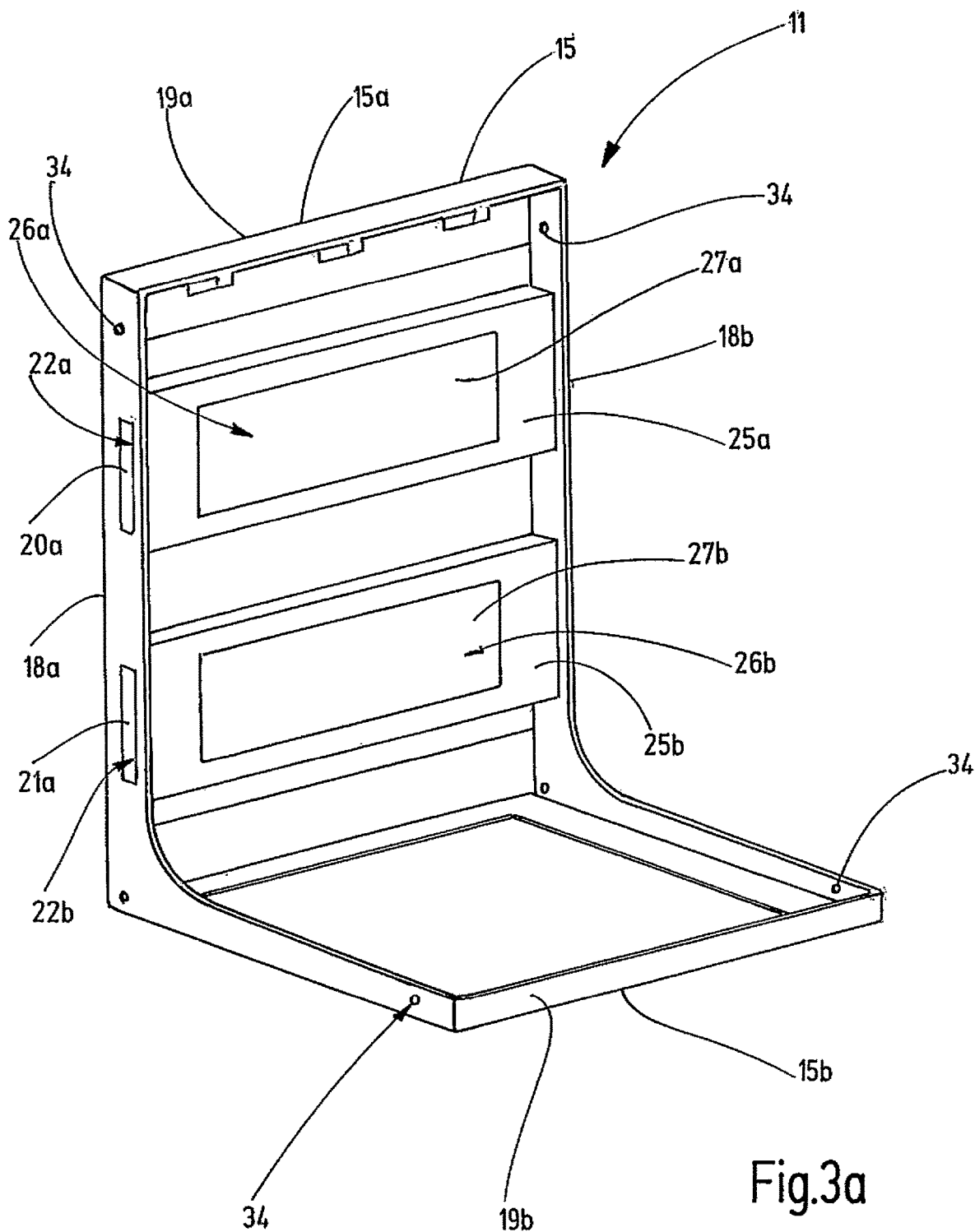
FIGS. 3a-3d show sub-modules of a wall module of a modular system for producing, for example, the housing according to FIGS. 1 and 2.
Figure 3B:
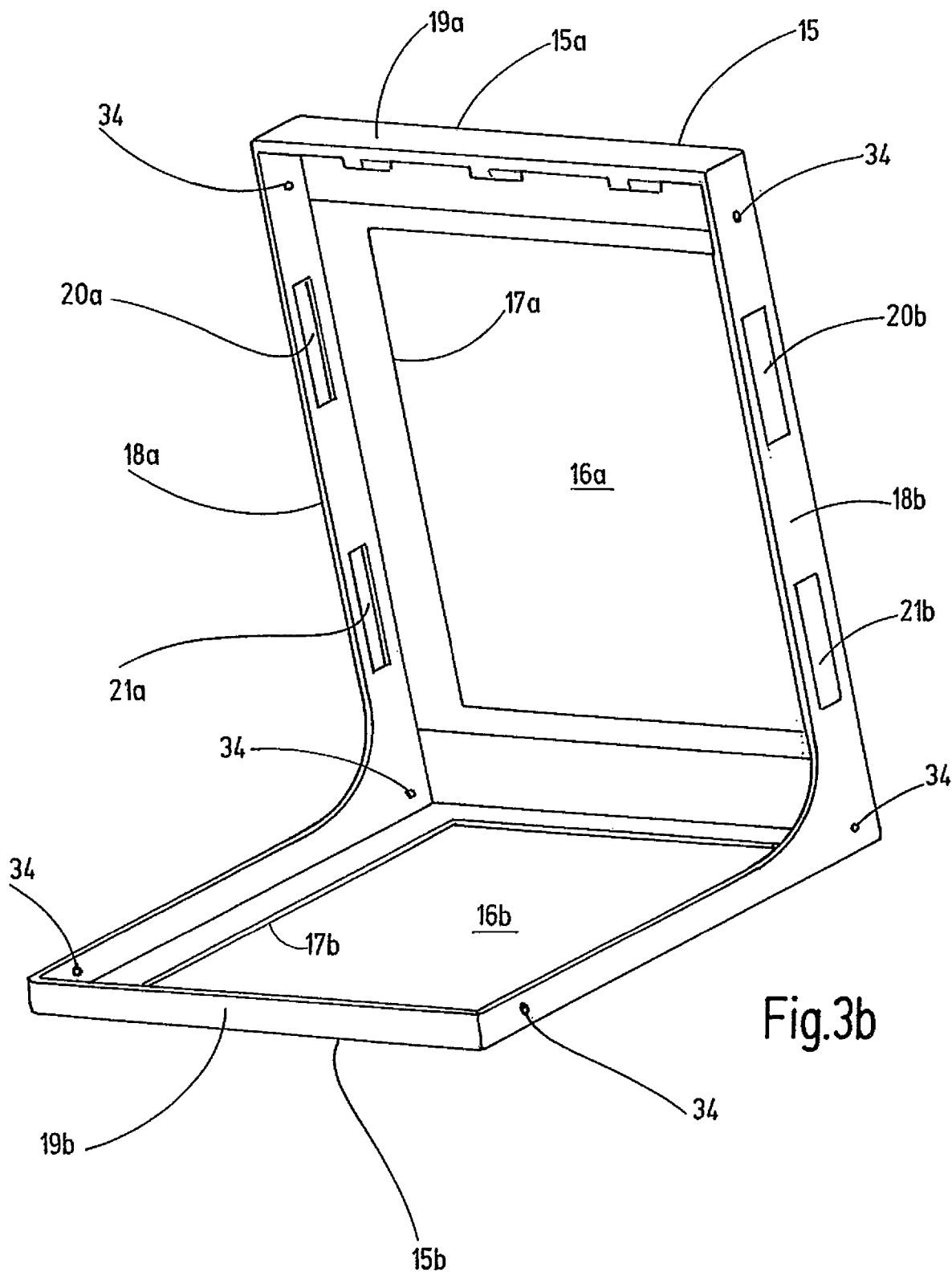
Figure 3C:
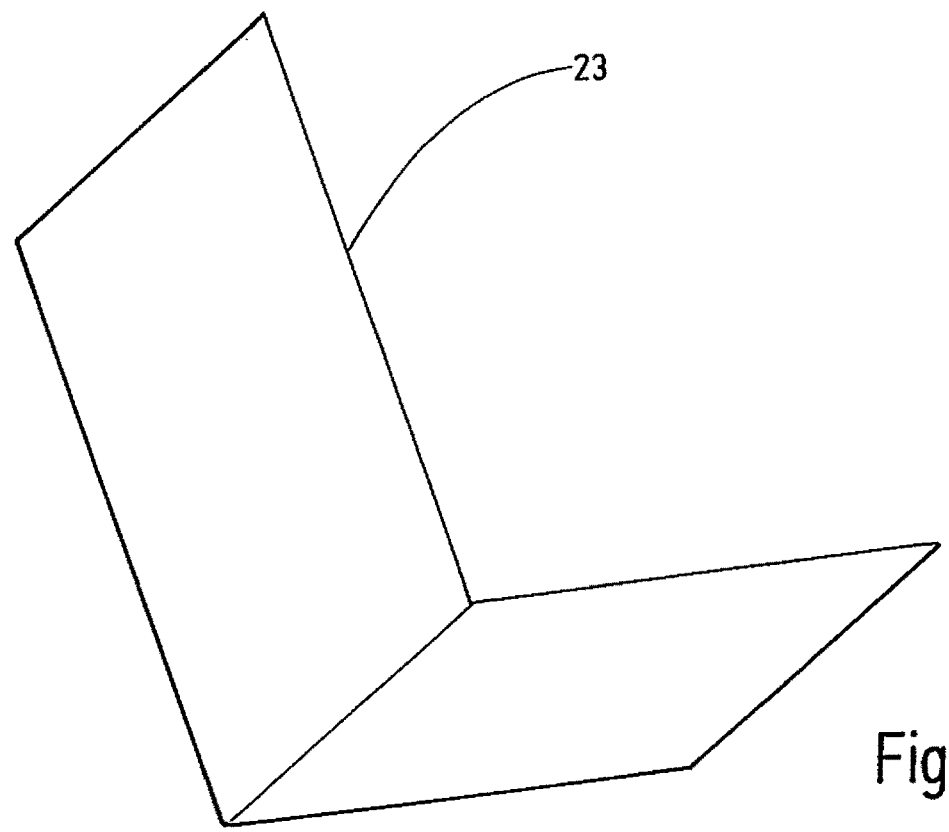
Figure 3D:
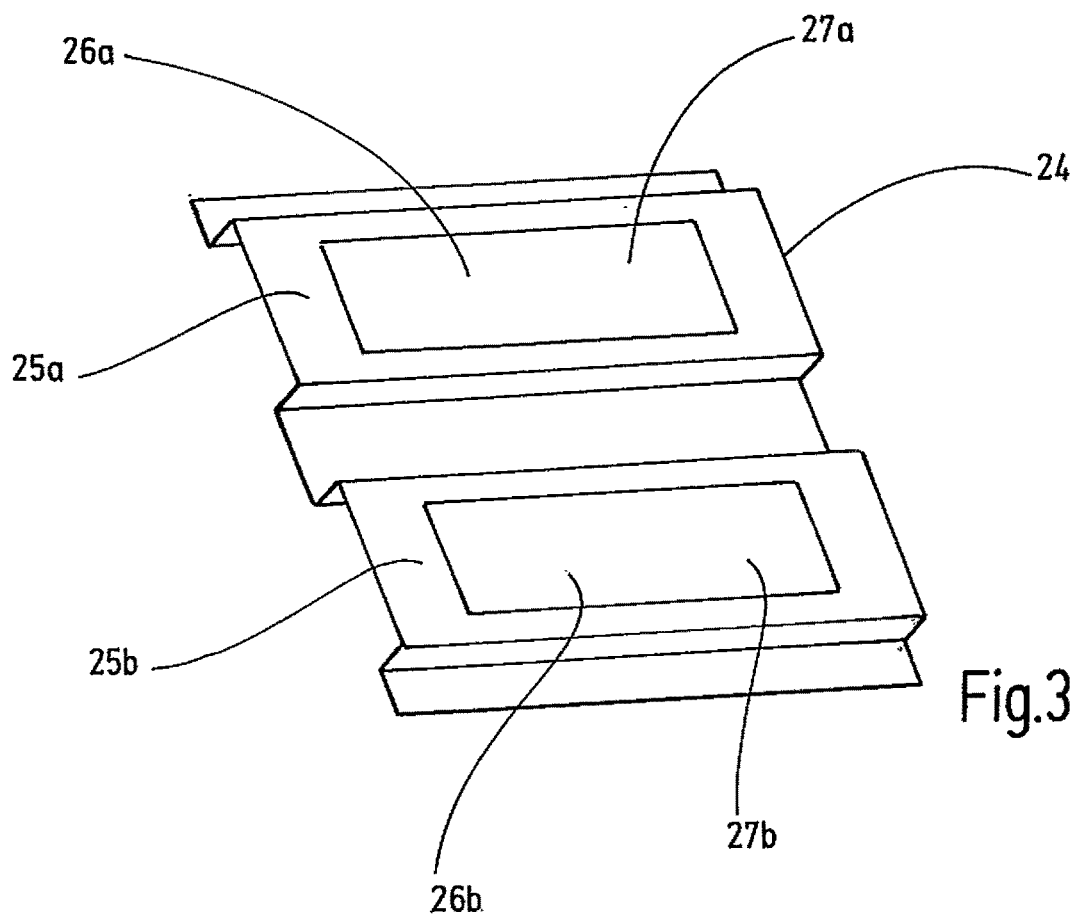

FIG. 3a shows a specimen of a module type 11 of the modular system. FIGS. 3b, 3c, and 3d show different elements (sub-modules) of the module type 11.

The module 11 is a wall module, which separates the interior space 13 of the housing 10, which is provided for arranging components that can form ignition sources, from the surrounding area 14 of the housing 10. The module 11 forms at least one section of the wall of the housing 10. The module 11 is angled or L-shaped. Other embodiments of modules according to the invention can be U-shaped. Angled or U-shaped modules can include an edge or an edge section of the housing. In this way, the formation of an edge section by connecting two modules into an edge section can be dispensed with. Still other embodiments can be substantially planar and, possibly, comprise an appendage protruding toward the surface area of the module at an angle for the attachment to an adjoining module.

The module 11 can, as illustrated, comprise a frame-shaped base body 15 (see FIG. 3b) comprising two flat sections 15a, 15b, which form an angle, as a base element. At least one of the sections 15a, 15b or both sections 15a, 15b can include a recess 16a, 16b, which is surrounded by an attachment region 17a, 17b. The base body 15 can be a casting. At least one or two rib sections 18a, 18b of the base body 15 can stabilize the angle of the sections 15a, 15b. The rib sections 18a, 18b can be arranged on opposite edges of the base body 15. As shown, the rib sections 18a, 18b can be connected at opposite ends of the base body by a respective attachment section 19a, 19b. The rib sections 18a, 18b can include openings 20a, 20b, 21a, 21b located opposite one another in pairs, which form ports of one or more (two in the exemplary embodiment shown) module interior spaces 22a, 22b.

The recess or the recesses 16a, 16b can be closed by means of one or more first elements 23 in the assembled wall module. The first element or elements 23 can be sheet metal elements, for example. FIG. 3c shows an angled or L-shaped sheet metal element as a first element 23 for closing both recesses 16a, 16b. As an alternative, two separate sheet metal elements can be provided for closing the recesses 16a, 16b. The first element or elements 23 for closing the recess or recesses 16a, 16b is or are held by the base body 15.

The sheet metal element 23 can be arranged on the outside of the base body 15, as shown, or on the inside of the base body 15. The first element or elements 23 can in particular be welded and/or bonded to the base body 15 in the wall module 11. The sheet metal element 23 can, for example, be welded or bonded to the attachment section or sections 19a, 19b.

At least one second sheet metal element 24 can be arranged on at least one section of the first sheet metal element 23, so as to delimit at least one, for example channel-like, module interior space 22a, 22b, for example having a rectangular cross-section, together with the first sheet metal element 23. The wall module 11 accordingly includes a module interior space 22a, 22b delimited from the housing interior space 13. The second sheet metal element 24 is arranged adjoining the first sheet metal element 23 on the inner side of the base body 15. Embodiments in which both the first sheet metal element 23 and the second sheet metal element 24 are arranged on the outer side are possible. Embodiments in which both the first sheet metal element 23 and the second sheet metal element 24 are arranged on the inner side of the base body 15 are possible.

So as to form at least one channel-shaped module interior space 22a together with the first sheet metal element 23, the second sheet metal element 24 can comprise at least one or more (for example two, as shown) raised beads 25a, 25b. These raised beads 25a, 25b form the flat channels 22a 22b together with the opposite first sheet metal element 23. Embodiments in which the sheet element 24 arranged on the inner side is free of beads, and the first sheet metal element 23 arranged on the outer side comprises beads, are possible. Embodiments in which both the first sheet metal element and the second sheet metal element 23, 24 comprise beads, are possible, which can be arranged adjoining one another so as to form two halves of a channel-shaped interior space 22a, 22b.

At least one or each of the raised beads 25a, 25b can include a connection opening 26a, 26b. The connection opening 26a, 26b connects the housing interior space 13 to the module interior space 22a, 22b.

The connection opening 26a, 26b can be closed by a pressure relief body 27a, 27b. This means that gas, in order to pass the connection opening 26a, 26b, has to flow through the pressure relief body 27a, 27b first, during the process or afterwards, so as to flow from the interior space 11 of the housing 10 into the module interior space 22a, 22b. The pressure relief body 27a, 27b can be flameproof and consequently close the connection opening 26a, 26b in a flameproof manner, so that hot gas and/or particles from the interior space 13 of the housing 10 can enter the module interior space 22a, 22b only in such a cooled state that gas present in the module interior space 22a, 22b is not ignited. In other embodiments, the closure of the connection opening 26a, 26b by the pressure relief body 27a, 27b is not flameproof. The pressure relief body 27a, 27b has open pores, which in embodiments form gaps that are so narrow and so long that flame propagation through the gaps is prevented. Due to the large pore surface, pressure relief bodies 27a, 27b, regardless of whether or not these are flameproof, can withdraw heat from the flowing gas, and additionally withdraw heat therefrom, if necessary, through expansion, for example as a result of the Joule-Thomson effect and/or through adiabatic expansion.

For example, the pressure relief body 27a, 27b can be composed of multiple wire gauze layers, in particular woven wire cloth layers, which can be connected to one another by sintering to form a solid body. As an alternative, the pressure relief body 27a, 27b can, for example, have been created from metal particles, in particular metal spheres, ceramic spheres or the like, by sintering. In embodiments, a random fiber body can form a pressure relief body 27a, 27b.

The channel-shaped elongated module interior space 22a, 22b, formed between the two sheet metal elements 23, 24, can, for example, be connected at both ends to a respective port opening 20a, 20b or 21a, 21b in the rib section 18a, 18b.

The connection of the second sheet metal element 24 to the base body 15 can also be carried out by way of bonding and/or welding, for example. If the module interior space 22a, 22b is to be separated from the housing interior space 13 in a flameproof manner, weld and/or bonded seams between the first sheet metal element 23 and the base body 15, and the second sheet metal element and the base body, are preferably sealing seams to be able to dispense with a flameproof gap (Ex gap) in place of the sealing seam.

As is apparent from FIGS. 1 and 2, 2 specimens of the above-described module type 11 in each case surround a section of the interior space 13 of the housing 10 in a U-shaped manner. By varying the number of such pairs of modules 11 in an extension direction (for example height), it is possible to produce differently sized housings 10 by way of the wall module type 11 according to FIG. 3a. In the illustrated exemplary embodiment according to FIGS. 1 and 2, four pairs of specimens of the described wall module type 11 are arranged successively in a row. These successively arranged pairs of base bodies 15 form a frame-shaped housing base body, which is partially closed by means of the sheet metal elements 23, 24.

In principle, other module types can also form part of the modular system, for example a further module type can be a variant of the first module type, as shown in FIG. 3a. This can essentially be composed in the same manner as the module type 11 according to FIG. 3a. However, in the case of this module type or in the case of the variant of the first module type 11, the arrangement of a second sheet metal element 24 for forming module interior spaces 22a, 22b can be dispensed with, so that this module type does not establish a module interior space 22a, 22b.

Figure 4:
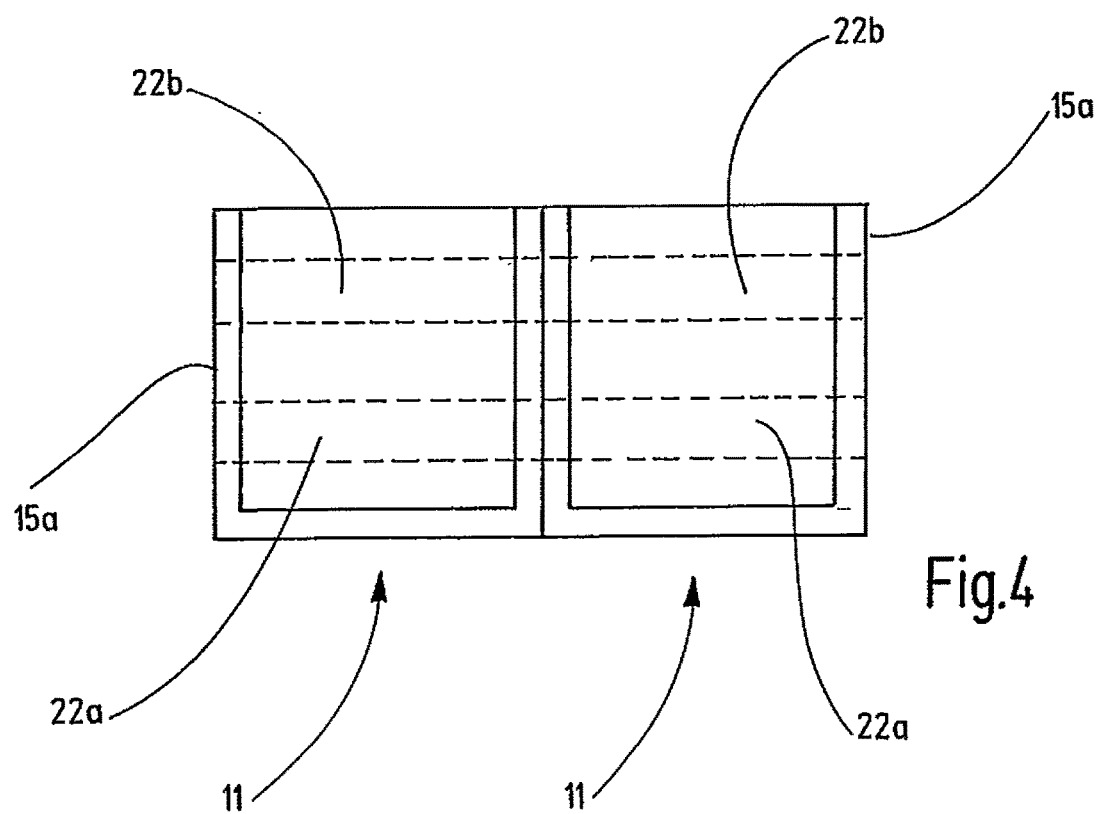
FIG. 4 shows a side view of a housing.

In the exemplary embodiment of the housing 10, each of the two parallel rows of wall modules 11 forms at least one flow channel, two flow channels in the exemplary embodiment shown, which is formed in each case of the channel sections 22a, 22b of the modules 11 of the row that are fluidically connected to one another in the longitudinal direction or row direction. The channels or module interior spaces 22a, 22b of the module extend in the row direction so that, when the modules 11 are arranged in succession, the port openings 20a, 20b or 21a, 21b are automatically arranged so as to abut one another in a flush manner. This makes it particularly easy to connect the module interior spaces 22a, 22b to form a contiguous channel, since this occurs as part of the connection of mutually abutting modules 11. This is illustrated in FIG. 4 based on a side view of a row of two wall modules 11 abutting in the row direction. The progression of the module interior spaces 22a, 22b extending in the row direction, which are flush with one another when the walls modules 11 are arranged next to one another, is illustrated with dotted lines.

Modules 11 that abut one another within a pair and/or modules 11 that abut one another in the row direction can, for example, be welded and/or bonded to one another to form the housing 10. The butt seams between modules 11 abutting one another in a pair or in a row direction can, for example, be welded by means of a submerged arc welding method. Sealing seams are preferably formed between the wall modules 11 of the pairs and/or between the wall modules 11 abutting in the row direction, for example of the type according to FIG. 3a. These can be weld seams and/or bonded seams. A flameproof gap in this location is replaced with the provision of a sealing seam.

In embodiments of the modular system, the modules 11, according to a method according to the invention for producing a housing 10, can be arranged to form the housing 10 and/or a housing section and can be aligned in pairs and/or by row sections, before the alignment is fixed, for example, by means of bonding and/or welding and/or screwing together. The base body can include an alignment device for this purpose, for example boreholes 34 in the rib sections. In addition or as an alternative to the compensation for relatively rough tolerances, it is possible to ensure by means of the alignment, preferably based on the alignment device, that port openings 20a, 20b, 21a, 21b of module interior spaces of abutting modules 11 abut one another in correct positional arrangement so as to form a contiguous channel made of module interior spaces 20a, 20b, 21a, 21b.

As is apparent from FIGS. 1 and 2, the interior space 13 of the housing 10 surrounded in a U-shaped manner by the row of pairs is closed at both ends of the row by a respective plate-shaped element 30, 31. The plate-shaped elements 30, 31 can be welded and/or bonded to the wall modules 11, forming sealing seams. The plate-shaped elements 30, 31 can both terminate the channels, formed of the module interior spaces 22a, 22b, with respect to the surrounding area 14. The channels thus form an interior pressure relief volume, which is not connected to the surrounding area 14 of the housing 10.

Figure 5:
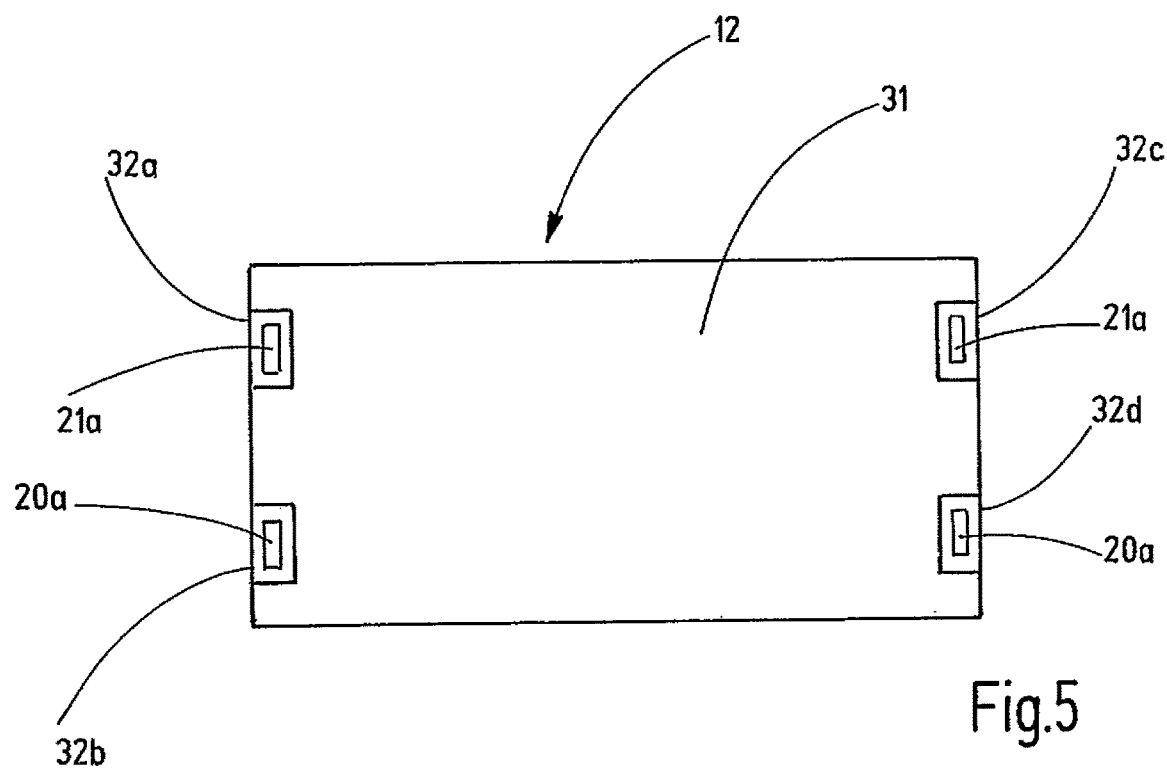
FIG. 5 shows a top view onto a side the housing according to FIGS. 1, 2.

In preferred embodiments, at least one of the plate elements 30, 31, preferably at least the upper plate element 31 when the housing is in use, includes openings 32a-d or recesses or cut-outs, to which the flow channels are connected with the port opening 20a, 21a thereof of the modules 11 in the last row, so as to form venting openings 33a-33d for the flow channels. This is illustrated in FIG. 5, which shows a top view onto the upper side of the housing 10 according to FIGS. 1 and 2 in a state in which the port openings 20a, 21a of the wall modules 11 of the uppermost row are visible through which openings 32a-d in the plate-shaped element 31. These port openings 20a, 21a form the port openings of the channel assembled from module interior spaces 22a, 22b, which abut the venting openings 33a-33d in a flush manner or form these. The plate element 31 can form a module of the modular system, which is dimensioned so that the port openings 20a, 21a of the module interior spaces 22a, 22b of the abutting modules 11 abut the openings 32a-d in the plate element 31, when the plate element 31 is arranged at the row of pairs of modules 11. The venting openings 33a-33d are preferably closed in a flameproof manner (see FIG. 6), for example by gas-permeable pressure relief bodies 35a-d welded onto the openings 32a-d, the pressure relief bodies being flameproof. The pressure relief bodies can be protected against environmental influences, such as dirt and/or moisture, by means of a protective element, to prevent pores of the pressure relief body from becoming clogged with dirt and/or moisture. In the event of an explosion in the interior space of the housing, the protective element can be automatically ruptured or destroyed, to expose the connection through the venting openings through the gas-permeable pressure relief bodies 35a-d.

In the illustrated exemplary embodiment, the modules 11 are arranged in such a way (see FIG. 1) that the module interior spaces 22a, 22b are established in the side walls of the housing 10. In embodiments, the module 11 shown in FIG. 3a can be (variably) arranged in such a way that, as an alternative or in addition, the module interior spaces 22a, 22b are established in the rear wall 12 of the housing 10.

Housings 10 having different heights can be produced by the module 11 of the modular system according to FIG. 3a. As an alternative or in addition, modules 11 can be provided in modular systems according to the invention by means of which housings 10 having different footprints, different circumferences and/or shapes 10 that differ from the cuboidal shape can be produced. Modules 11 can be configured to not only delimit cuboidal interior spaces 13, but, for example, to also delimit interior spaces across the corners, for example in an L or U shape. The module interior spaces 22a, 22b can be aligned along an extension direction, for example a length, width or depth extension of the housing. As an alternative or in addition, module interior spaces 22a, 22b can extend in the circumferential direction, for example to form a U-shaped channel.

The module interior spaces 22a, 22b are preferably empty, if necessary, with the exception of pressure relief bodies 27a, 27b arranged therein for closing the connection opening. The empty cavities form absorption chambers for a pressure wave coming from the interior space 13. The cavities can additionally help to increase the deformation resistance, i.e., to increase the rigidity and load-bearing capacity of the housing wall.

If an explosion occurs in the interior space of the housing, the pressure relief bodies 27a, 27b primarily act as heat sinks. As mentioned, the pressure relief bodies 27a, 27b do not necessarily have to be designed to be flameproof, in particular when the module interior spaces 22a, 22b are closed with respect to the outside. A propagation of an explosion that occurs in the interior space 13 of the housing 10 into the module interior space 22a, 22b does not necessarily have to be precluded. For this reason, the pressure relief body 27a, 27b at the connection opening 26a, 26b may also be dispensed with or, in any case, may not be flameproof. In a preferred embodiment, the pressure relief body 27a, 27b, however, is not only present in general, but additionally also designed to be flameproof, whereby a propagation of the explosion into the module interior space 22a, 22b is precluded if an explosion is ignited in the interior space 13. The module interior space 22a, 22b thus acts particularly effectively as a pressure sink. An explosion of an appropriate gas mixture ignited in the interior space 13 of the housing 10 propagates via the possibly present pressure relief bodies 27a, 27b, or also via venting openings 26a, 26b left open, into the module interior spaces 22a, 22b, which form cavities in the housing wall. In the process and at the walls of the module interior spaces 22a, 22b, the gas mixture undergoes rapid cooling, which results in a volume reduction, and thus a pressure reduction. The ratio of the surface to the volume of the module interior space or spaces 22a, 22b is preferably considerably greater than the ratio of the surface to the volume of the housing interior space 13. In this way, and as a result of the action of the possibly present porous pressure relief body 27a, 27b for closing the connection opening or the connection openings 26a, 26b in a gas-permeable manner and/or as a result of the venting openings 33a-33d, rapid cooling of the gases heated by the explosion, and thus a considerable pressure reduction, is achieved. It is therefore sufficient when the housing wall is designed with a relatively thin wall thickness in sections. In embodiments, for example, the first element 23 and the second element 24 thus only have sheet metal thickness.

The concept according to the invention is in particular suitable for large housings 10 having a housing interior volume of 500 liters or more, or even 1000 liters or more. Nonetheless, the concept can also be used for smaller housings 10. Due to the connection openings that are distributed in the row direction and form pressure relief openings 26a, 26b, it is possible, in particular in the case of a large housing 10, when only a partial volume of the gas mixture present in the housing interior space 13 is ignited, to reduce the pressure wave with the aid of at least one pressure relief opening 26a, 26b, and to push unburned gas from the interior space 13 of the housing 10, through the pressure relief or connection openings 26a, 26b distributed over the lateral surfaces, into the contiguous intermediate volume, formed by the module interior spaces 22a, 22b, so as not to become ignited.

For example, steel, aluminum and/or plastic are materials that can be used for the module 11. For example, the base body 15 can be produced from gray cast iron, cast steel, or plastic molding. The sheet metal elements 23, 24 can be steel, aluminum or plastic sheets, for example.

Figure 6:
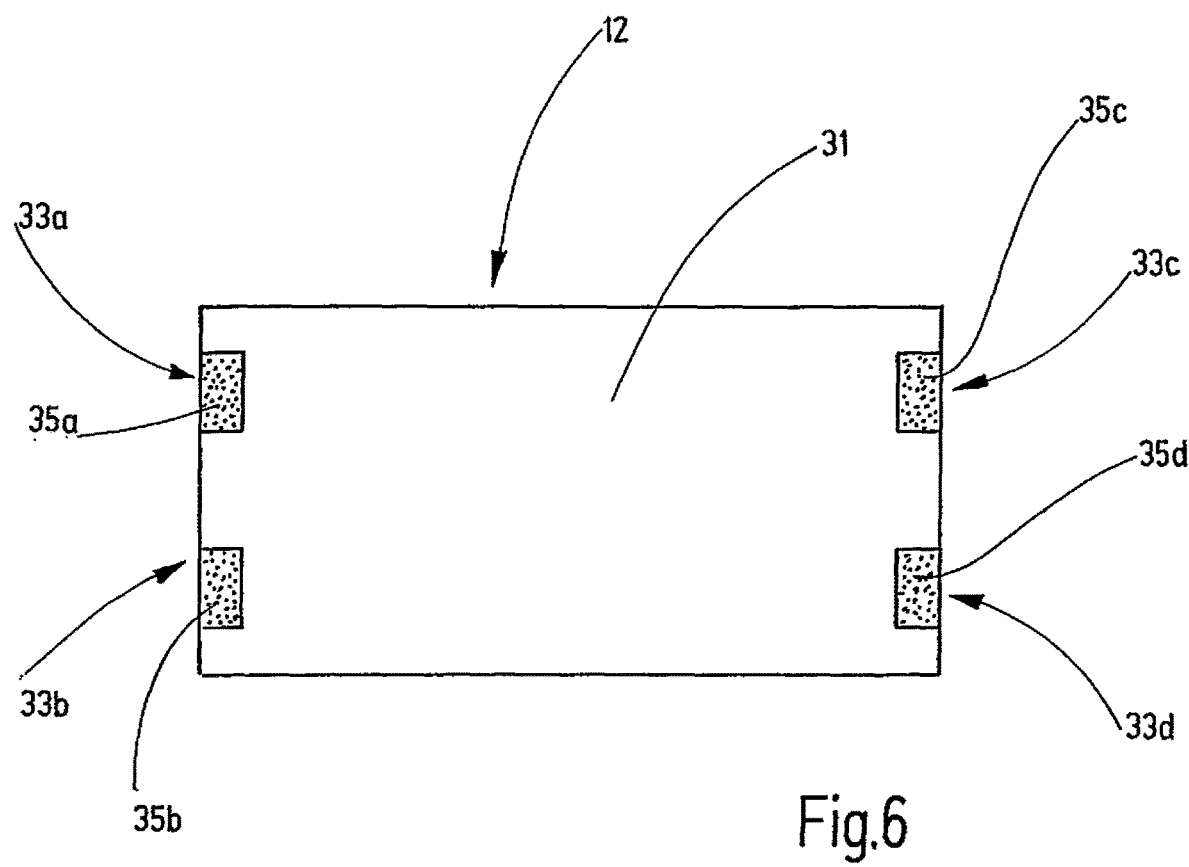
FIG. 6 shows the top view according to FIG. 4, including venting openings closed by pressure relief bodies.
Figure 7:
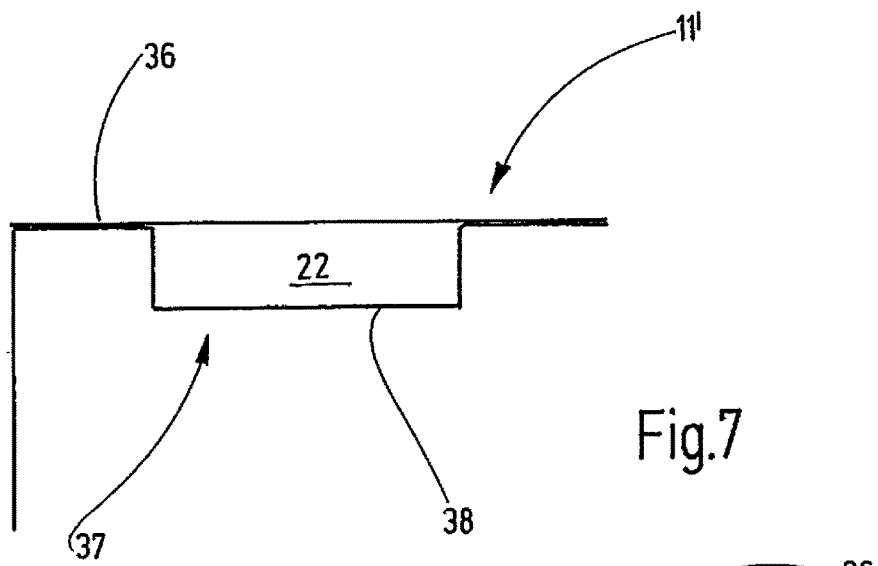
FIG. 7 shows an example of a wall module, assembled from two sheet metal modules.
Figure 8A:
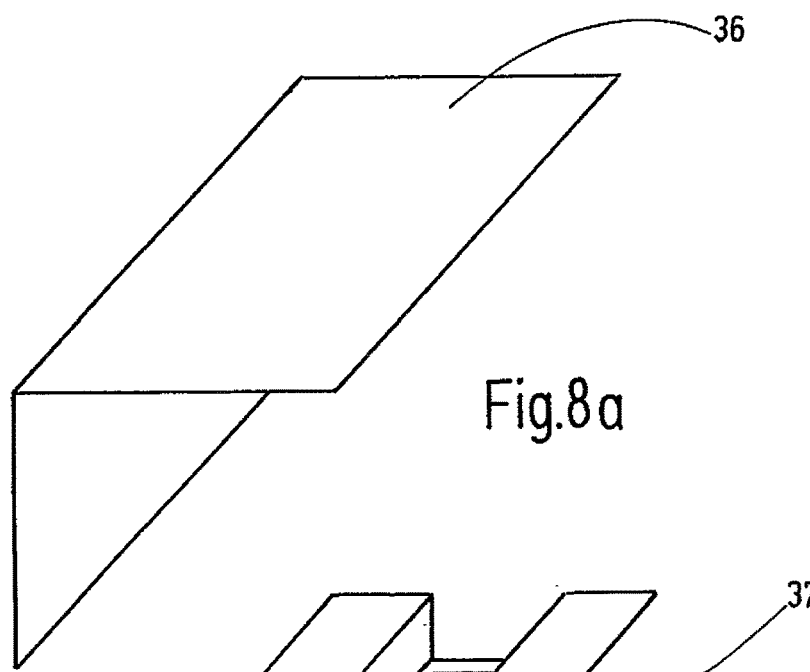
FIG. 8a shows a first sheet metal module for the wall module according to FIG. 7.
Figure 8B:
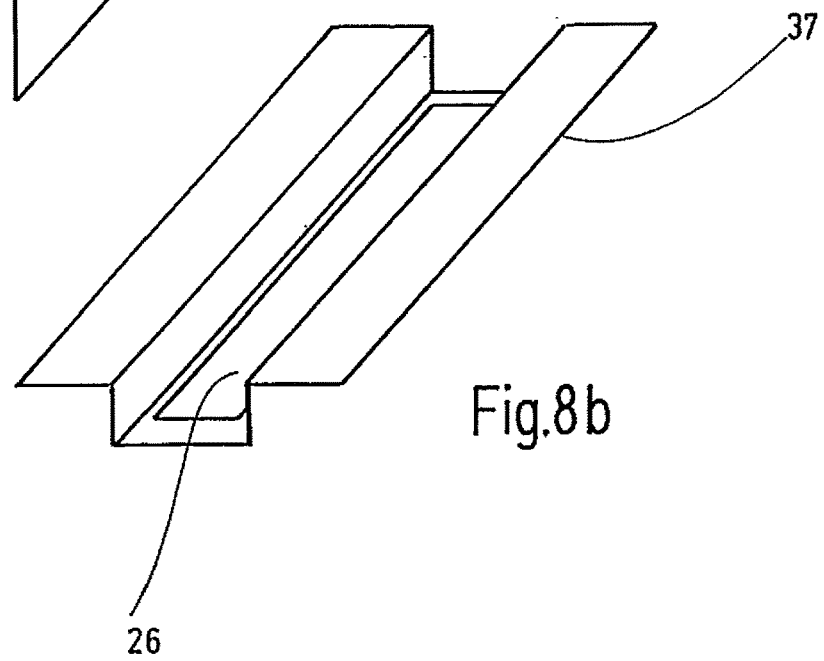
FIG. 8b shows a second sheet metal module for the wall module according to FIG. 7.

FIG. 6 shows an exemplary embodiment of a wall module 11' of a modular system according to the invention, which is composed of sheet metal parts 36, 37. A first sheet metal part 36 can, as shown (see FIG. 7a), be angled or L-shaped, for example. In other embodiments, the first sheet metal part 36 can be planar with or without an attachment edge for attaching abutting modules. In other embodiments, the module can be U-shaped. A second sheet metal part 37 (see FIG. 7b) can comprise at least one raised bead 38, so as to delimit an elongated module interior space 22 between the first sheet metal part 36 and the second sheet metal part 37. The module 11' can be connected to a specimen of the same module type to form a pair. Multiple pairs can be arranged in succession in a row direction, wherein module interior spaces 22 abut one another with the port openings thereof so as to form a contiguous channel made of module interior spaces 22. For example, a connection opening 26 can be provided in the raised bead 38 for fluidically connecting the housing interior space 14 to the module interior space between the raised bead and the first sheet metal part 36, which can be closed by a gas-permeable pressure relief body.

According to the invention, a module 11, 11' for producing a housing 10, in particular a housing 10 of the 'flameproof enclosure' protection type, is provided, wherein the housing 10 surrounds an interior space 13, which is suitable for accommodating components that can form ignition sources. The electrical or electronic components can be connected to conductors of at least one flameproof electrical feedthrough (not shown) to electrically contact the components from outside the housing 10. The feedthrough can be arranged in a first element 23, for example. The module 11, 11' establishes at least one module interior 22a, 22b, which is fluidically connected via a connection opening 26a, 26b to the interior space 13 of the housing 10. The module can be used to produce vented housings having different interior volumes.

LIST OF REFERENCE NUMERALS

| | |
|---|---|
| 10 | housing |
| 11, 11' | wall module |
| 12 | rear side |
| 13 | interior space |
| 14 | surrounding area |
| 15 | base body |
| 15a | first section |
| 15b | second section |
| 16a | recess |
| 16b | recess |
| 17a | attachment region |
| 17b | attachment region |
| 18a | rib section |
| 18b | rib section |
| 19a | attachment section |
| 19b | attachment section |
| 20a, 20b | openings |
| 21a, 21b | openings |
| 22 | module interior space |
| 22a, 22b | module interior space |
| 23 | first element |
| 24 | second element |
| 25a, 25b | raised bead |
| 26 | connection opening |
| 26a | connection opening |
| 26b | connection opening |
| 27a | pressure relief body |
| 27b | pressure relief body |
| 30 | plate-shaped element |
| 31 | plate-shaped element |
| 32a-d | openings |
| 33a-33d | venting openings |
| 34 | borehole |
| 35a-d | pressure relief body |
| 36 | First sheet metal part |
| 37 | Second sheet metal part |
| 38 | raised bead |

The invention claimed is:

1. A module for forming a portion of a housing, the housing surrounding an interior space of the housing suitable for accommodating components that can form ignition sources, the module establishing at least one module interior space, which is fluidically connected to the interior space of the housing through a connection opening.

2. The module according to claim 1, wherein the module comprises a base element, which holds at least one wall element that delimits the at least one module interior space.

3. The module according to claim 1, wherein the module is one of a plurality of modules, wherein when the plurality of modules are arranged in succession to form a channel made of fluidically contiguous interior spaces of the plurality of modules.

4. The module according to claim 3, wherein port openings of each of the fluidically contiguous interior spaces of the plurality of modules are aligned with one another.

5. The module according to claim 4, wherein the port openings abut one another.

6. The module according to claim 1, wherein the connection opening is closed by a gas-permeable pressure relief body.

7. The module according to claim 6, wherein the gas-permeable pressure relief body closes the connection opening in a flameproof manner.

8. A housing comprising a module according to claim 1, wherein the housing includes a venting opening, which fluidically connects the at least one module interior space to a surrounding area of the housing.

9. The housing according to claim 8, wherein a port opening of the at least one module interior space is directed at the venting opening of the housing or forms the venting opening.

10. A method for producing a housing according to claim 1.

11. The module according to claim 2, wherein the module is one of a plurality of modules, wherein when the plurality of modules are arranged in succession to form a channel made of fluidically contiguous interior spaces of the plurality of modules.

12. The module according to claim 2, wherein the connection opening is closed by a gas-permeable pressure relief body.

13. The module according to claim 3, wherein the connection opening is closed by a gas-permeable pressure relief body.

14. The module according to claim 4, wherein the connection opening is closed by a gas-permeable pressure relief body.

15. The module according to claim 5, wherein the connection opening is closed by a gas-permeable pressure relief body.

16. The module according to claim 11, wherein the connection opening is closed by a gas-permeable pressure relief body.

17. A The module according to claim 16, wherein the gas-permeable pressure relief body closes the connection opening in a flameproof manner.

* * * * *